United States Patent
Meehan et al.

(10) Patent No.: US 11,953,567 B2
(45) Date of Patent: Apr. 9, 2024

(54) MAGNETIC MULTI-TURN SENSOR AND METHOD OF MANUFACTURE

(71) Applicant: Analog Devices International Unlimited Company, Limerick (IE)

(72) Inventors: Peter Meehan, Mungret (IE); Stephen O'Brien, Clarina (IE); Jochen Schmitt, Biedenkopf (DE); Michael W. Judy, Ipswich, MA (US); Enno Lage, Kiel (DE)

(73) Assignee: Analog Devices International Unlimited Company, Limerick (IE)

( * ) Notice: Subject to any disclaimer, the term of this patent is extended or adjusted under 35 U.S.C. 154(b) by 25 days.

(21) Appl. No.: 17/412,046

(22) Filed: Aug. 25, 2021

(65) Prior Publication Data

US 2022/0075010 A1    Mar. 10, 2022

Related U.S. Application Data

(60) Provisional application No. 63/075,453, filed on Sep. 8, 2020.

(51) Int. Cl.
*G01R 33/09* (2006.01)
*H01L 23/522* (2006.01)
(Continued)

(52) U.S. Cl.
CPC ......... *G01R 33/098* (2013.01); *G01R 33/093* (2013.01); *H01L 23/5227* (2013.01);
(Continued)

(58) Field of Classification Search
CPC .......................... G01R 33/098; G01R 33/093
See application file for complete search history.

(56) References Cited

U.S. PATENT DOCUMENTS

| 5,572,179 A | 11/1996 | Ito et al. |
| 5,610,433 A | 3/1997 | Merrill et al. |

(Continued)

FOREIGN PATENT DOCUMENTS

| CN | 101644748 B | 8/2011 |
| DE | 4117878 C2 | 9/1996 |

(Continued)

OTHER PUBLICATIONS

Extended European Search Report in Application No. 21195049.8, dated Jan. 27, 2022, 9 pages.
(Continued)

*Primary Examiner* — Alesa Allgood
(74) *Attorney, Agent, or Firm* — Knobbe, Martens, Olson & Bear, LLP

(57) ABSTRACT

The present disclosure provides a magnetic multi-turn sensor comprising a continuous coil of magnetoresistive elements and a method of manufacturing said sensor. The continuous coil is formed on a substrate such as a silicon wafer that has been fabricated so as to form a trench and bridge arrangement that enables the inner and outer spiral to be connected without interfering with the magnetoresistive elements of the spiral winding in between. Once the substrate has been fabricated with the trench and bridge arrangement, a film of the magnetoresistive material can be deposited to form a continuous coil on the surface of the substrate, wherein a portion of the coil is formed in the trench and a portion of the coil is formed on the bridge.

5 Claims, 22 Drawing Sheets

(51) Int. Cl.
*H01L 23/64* (2006.01)
*H10N 50/01* (2023.01)
*H10N 50/80* (2023.01)
*H10N 50/85* (2023.01)

(52) U.S. Cl.
CPC ........... *H01L 23/645* (2013.01); *H10N 50/01* (2023.02); *H10N 50/80* (2023.02); *H10N 50/85* (2023.02)

(56) References Cited

U.S. PATENT DOCUMENTS

| | | | |
|---|---|---|---|
| 5,719,073 | A | 2/1998 | Shaw et al. |
| 6,013,573 | A | 1/2000 | Yagi |
| 6,114,937 | A | 9/2000 | Burghartz et al. |
| 6,445,271 | B1 | 9/2002 | Burgess |
| 6,804,879 | B2 | 10/2004 | Hsiao et al. |
| 7,229,746 | B2 | 6/2007 | Schroeder et al. |
| 7,791,440 | B2 | 9/2010 | Ramadan |
| 8,289,021 | B2 | 10/2012 | Vigna |
| 8,310,328 | B2 | 11/2012 | Lin et al. |
| 8,366,009 | B2 | 2/2013 | Finn et al. |
| 8,749,337 | B2 | 4/2014 | Baram et al. |
| 8,928,162 | B2 | 1/2015 | Tien-Kan et al. |
| 8,975,612 | B2 | 3/2015 | Hoffman et al. |
| 9,406,740 | B2 | 8/2016 | Wang et al. |
| 9,859,052 | B2 | 1/2018 | Kurz et al. |
| 9,941,278 | B2 | 4/2018 | Labonte et al. |
| 10,566,126 | B2 | 2/2020 | Shimoichi |
| 2003/0067052 | A1 | 4/2003 | Matsuo et al. |
| 2005/0093667 | A1 | 5/2005 | Kilian |
| 2013/0328165 | A1 | 12/2013 | Harburg et al. |
| 2014/0353785 | A1 | 12/2014 | Paci |
| 2015/0102808 | A1* | 4/2015 | Ogomi ............... G06K 7/087 324/252 |
| 2016/0124091 | A1 | 5/2016 | Kawahito et al. |
| 2018/0340986 | A1 | 11/2018 | Latham et al. |
| 2018/0356252 | A1* | 12/2018 | Diegel ............... G01R 33/098 |

FOREIGN PATENT DOCUMENTS

| | | |
|---|---|---|
| DE | 10 2010 022 611 A1 | 12/2011 |
| EP | 2 128 637 A1 | 12/2009 |
| EP | 2267470 B1 | 1/2012 |
| JP | S61-63040 | 1/1986 |
| JP | S6163040 * | 4/1986 |
| JP | S61133645 A | 6/1986 |
| JP | 2010210348 A | 9/2010 |
| JP | WO 2010001987 A1 | 12/2011 |
| JP | 4885211 B2 | 2/2012 |
| JP | 5045617 B2 | 10/2012 |
| JP | 6265346 B2 | 1/2018 |
| WO | WO 2015/158243 A1 | 10/2015 |
| WO | WO 2017/199787 A1 | 11/2017 |
| WO | WO 2019/236759 A1 | 12/2019 |

OTHER PUBLICATIONS

Ramadan, et al., "Fabrication of Three-Dimensional Magnetic Microdevices With Embedded Microcoils for Magnetic Potential Concentration," Journal of Microelectromechanical Systems, vol. 15, No. 3, Jun. 2006, pp. 624-638.

Borie, et al., "Reliable Propagation of Magnetic Domain Walls in Cross Structures for Advanced Multiturn Sensors," Physical Review Applied, Oct. 2017, 10 pages.

Borie, et al., "Geometrically enhanced closed-loop multi-turn sensor devices that enable reliable magnetic domain wall motion," Applied Physics Letters 111, 242402 (2017).

Deak, James G., "Practical Tunneling Magnetoresistive Z-Axis Sensors," AMA Conferences 2015—Sensor 2015 and IRS2 2015, pp. 245-250.

Japanese Office Action dated Feb. 5, 2024 in related Japanese Application No. 2021-145467 (8 pages).

* cited by examiner

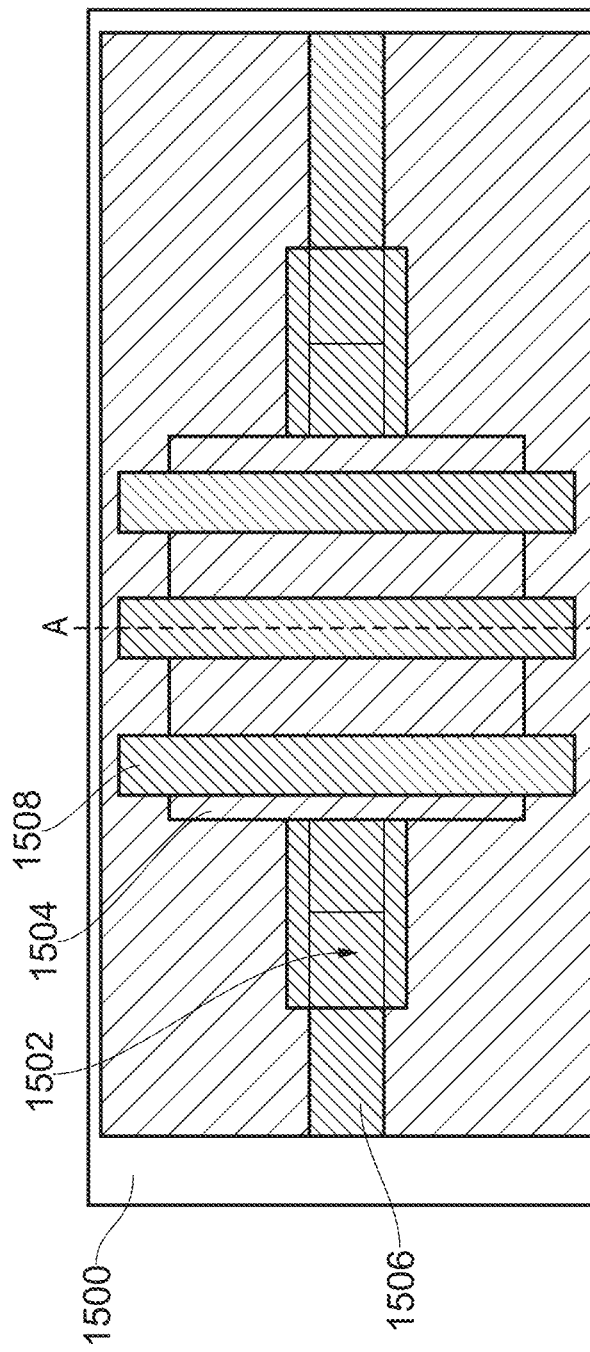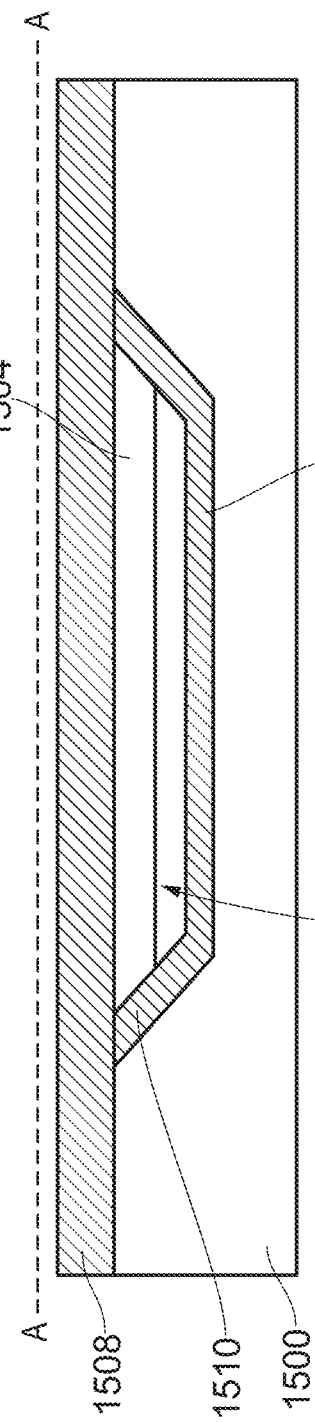
FIG. 15A
FIG. 15B

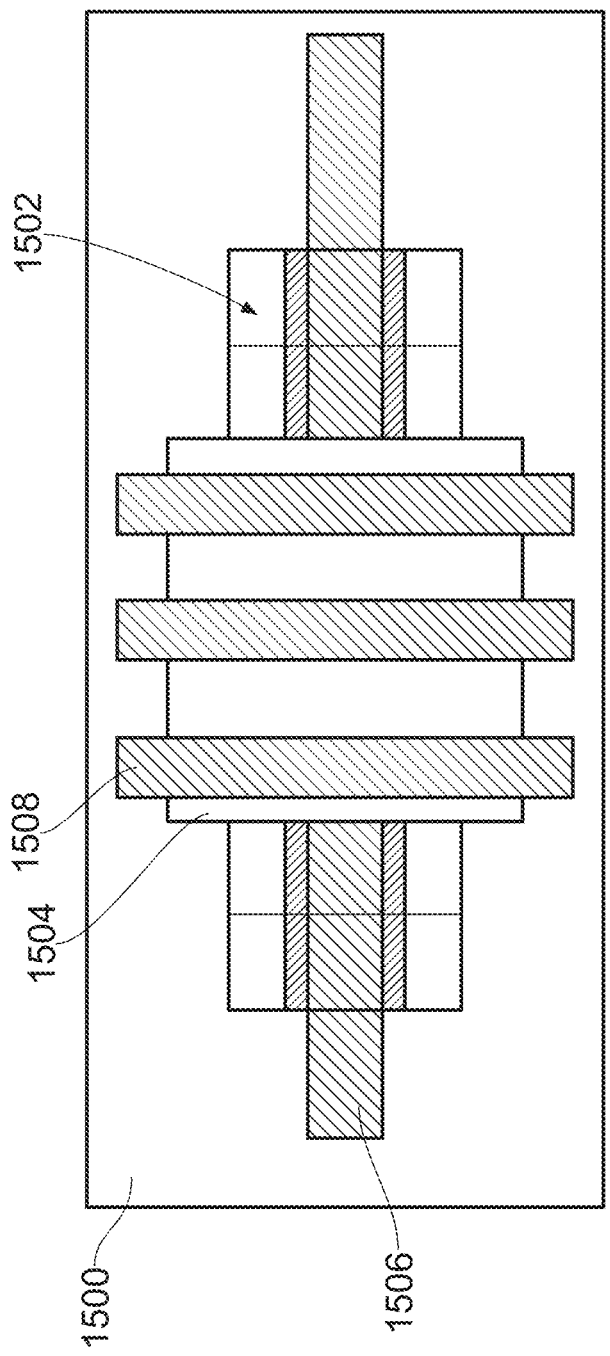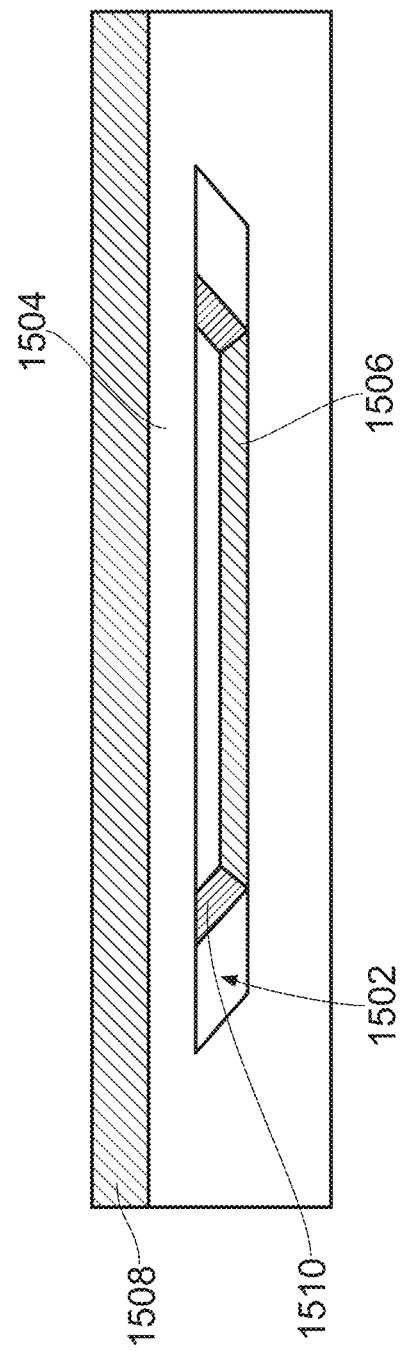
FIG. 16A
FIG. 16B

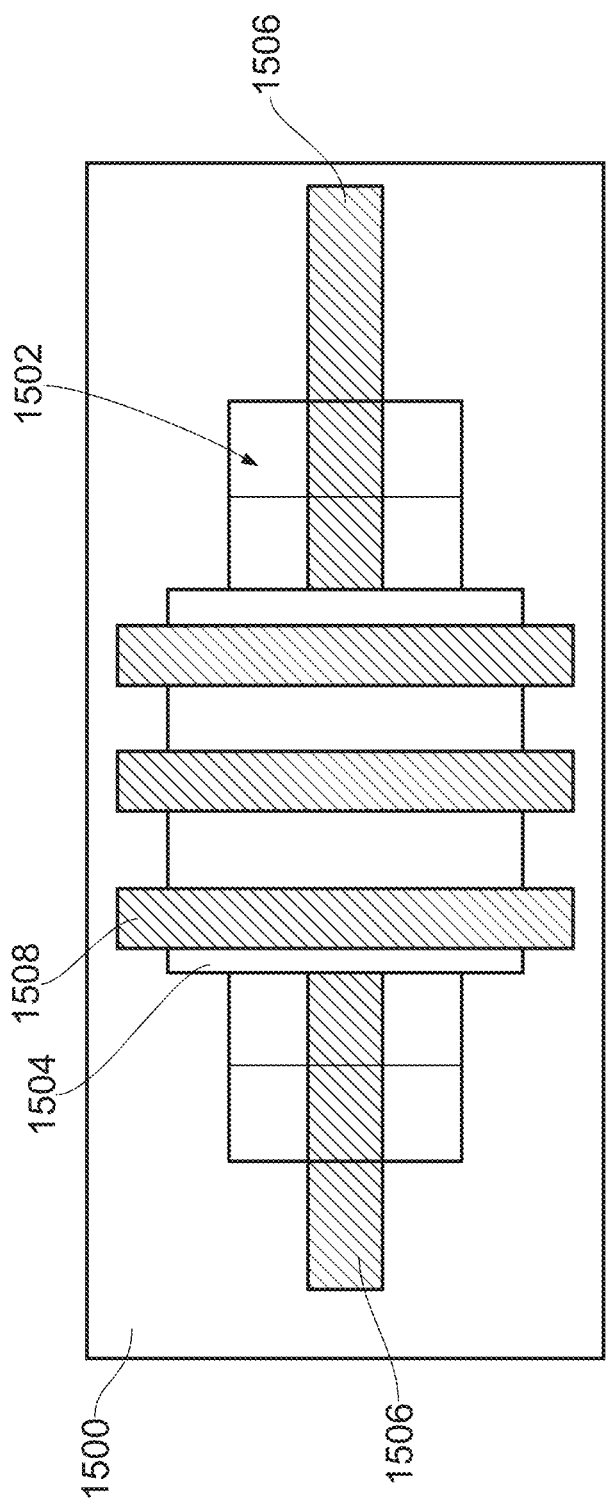
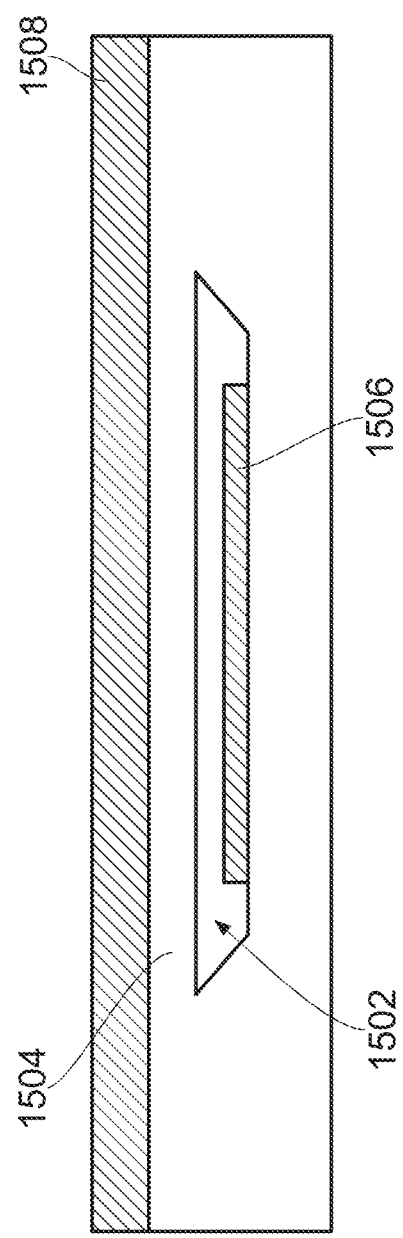
FIG. 17A
FIG. 17B

MAGNETIC MULTI-TURN SENSOR AND METHOD OF MANUFACTURE

INCORPORATION BY REFERENCE TO ANY PRIORITY APPLICATIONS

This application claims the benefit of priority of U.S. Provisional Application No. 63/075,453 filed Sep. 8, 2020, the content of which is hereby incorporated by reference herein in its entirety. Any and all applications for which a foreign or domestic priority claim is identified in the Application Data Sheet as filed with the present application are hereby incorporated by reference under 37 CFR 1.57.

FIELD OF DISCLOSURE

The present disclose relates to magnetic multi-turn sensors. In particular, the present disclosure relates to a closed loop magnetic multi-turn sensor and a method of manufacture.

BACKGROUND

Magnetic multi-turn sensors are commonly used in applications where there is a need to monitor the number of times a device has been turned. An example is a steering wheel in a vehicle. Magnetic multi-turn sensors typically include magnetoresistance elements that are sensitive to an applied external magnetic field. The resistance of the magnetoresistance elements can be changed by rotating a magnetic field within the vicinity of the sensor. Variations in the resistance of the magnetoresistance elements can be tracked to determine the number of turns in the magnetic field, which can be translated to a number of turns in the device being monitored.

Magnet multi-turn sensors typically comprise a plurality of magnetoresistive elements laid out as a strip in a spiral or closed loop configuration. One advantage of closed loop multi-turn sensors is that they effectively provide numerous spirals connected together, thus enabling a very high number of turns to be counted.

SUMMARY

The present disclosure provides a magnetic multi-turn sensor comprising a continuous coil of magnetoresistive elements and a method of manufacturing said sensor. The continuous coil is formed on a substrate such as a silicon wafer that has been fabricated so as to form a trench and bridge arrangement that enables the inner and outer spiral to be connected without interfering with the magnetoresistive elements of the spiral winding in between. Once the substrate has been fabricated with the trench and bridge arrangement, a film of the magnetoresistive material can be deposited to form a continuous coil on the surface of the substrate, wherein a portion of the coil is formed in the trench and a portion of the coil is formed on the bridge.

A first aspect provides a magnetic multi-turn sensor, comprising a plurality of magnetoresistive sensor elements connected in series and arranged in a continuous spiral configuration, a substrate on which the plurality of magnetoresistive elements are formed, the substrate comprising a trench configured to receive at least one magnetoresistive element, and at least one bridge formed over the trench, the bridge being configured to support at least one magnetoresistive element.

The trench may be configured to receive a plurality of magnetoresistive elements defining one side of the continuous spiral, and wherein the substrate comprises one bridge configured to receive one magnetoresistive element connecting an inner and outer loop of the spiral.

The trench may be configured to receive one magnetoresistive element connecting an inner and outer loop of the spiral, and wherein the substrate comprises at least one bridge formed over the trench for receiving a plurality of magnetoresistive elements defining one side of the spiral.

The substrate may comprise a plurality of bridges formed over the trench for receiving a plurality of magnetoresistive elements defining one side of the spiral, each bridge receiving one magnetoresistive element.

The magnetoresistive elements may be one of: giant magnetoresistive (GMR) elements and tunnel magnetoresistive (TMR) elements.

The substrate may comprise a wafer layer, an intermediate layer formed on the wafer layer, and a mask layer formed on the intermediate layer.

The trench may be formed by removing a portion of the intermediate layer and a portion of the mask layer.

The bridge may be formed by preserving a portion of the mask layer over the trench.

The wafer layer may comprise one of: a silicon layer, a glass layer, or a Sapphire layer.

The intermediate layer may comprise one of: an oxide layer, a nitride layer and an oxynitride layer.

The mask layer may comprise an epi silicon layer.

The mask layer may comprise a hard mask layer for selective etching.

The mask layer may comprise one of: a silicon oxide layer, a silicon oxynitride layer and a silicon nitride layer.

A further aspect provides a method of manufacturing a closed-loop magnetic multi-turn sensor, the method comprising forming a substrate comprising a wafer, an intermediate layer and a mask layer, etching a region of the mask layer and intermediate layer to form a trench in the substrate, wherein one or more portions of the mask layer is preserved to form at least one bridge over the trench, and depositing a magnetoresistor film on the substrate to form a continuous spiral of magnetoresistive elements, wherein at least one magnetoresistive element is formed in the trench.

At least one magnetoresistive element may be subsequently formed on the at least one bridge.

A plurality of magnetoresistive elements may be formed in the trench to define one side of the spiral, wherein the at least one magnetoresistive element formed on the at least one bridge connects an inner and outer loop of the spiral.

Alternatively, a plurality of magnetoresistive elements may be formed on the at least one bridge to define one side of the spiral, wherein the at least one magnetoresistive element formed in the trench connects an inner and outer loop of the spiral.

Etching a region of the mask layer and intermediate layer may further comprises forming a ramp in the mask layer and intermediate layer at each end of the trench.

Etching a region of the mask layer and intermediate layer may comprise a lithographic etch.

Depositing the magnetoresistor film may comprise using a tilt and rotate deposition system.

The method may further comprise etching the magnetoresistor film to form the magnetoresistive elements.

An ion beam etch or an angled reactive-ion (RIE) etch may be used to form the at least one magnetoresistive element in the trench.

In some cases, the wafer layer comprises a glass layer or Sapphire layer, in which case depositing the magnetoresistor film may comprise depositing a layer of photoresist material, depositing a layer of magnetoresistive film, and directing ultraviolet light from below the substrate to lift off the photoresist material and one or more portions of the magnetoresistive film.

The intermediate layer may comprise one of: an oxide layer, a nitride layer and an oxynitride layer.

The mask layer may comprise an epi silicon layer.

The mask layer may comprise a hard mask layer for selective etching. For example, the hard mask layer may comprise one of: a silicon oxide layer, a silicon oxynitride layer and a silicon nitride layer.

In such cases, a selective etchant is applied for etching a region of the intermediate layer under a region of the hard mask layer to form the at least one bridge. For example, the selective etchant may comprise one of: potassium hydroxide (KOH), ethylenediamine pyrocatechol (EDP) or tetramethylammonium hydroxide (TMAH).

Other arrangement described herein provide a magnetic multi-turn sensor, comprising a plurality of magnetoresistive sensor elements connected in series and arranged in a continuous spiral configuration, a substrate on which the plurality of magnetoresistive elements are formed, the substrate comprising at least one bridge formed over a first portion of the magnetoresistive elements, the bridge being configured to support at least one magnetoresistive element.

The bridge may be formed from a strip of magnetic material over the first portion of the magnetoresistive elements, wherein the magnetic material may be a soft ferromagnetic material. For example, the magnetic material may be a soft magnetic material comprising one of Nickel, Iron, or Cobalt, or an alloy containing at least one of Nickel, Iron, or Cobalt.

The first portion of the magnetoresistive elements may be a plurality of magnetoresistive elements defining one side of the continuous spiral, wherein the bridge is configured to receive one magnetoresistive element connecting an inner and outer loop of the spiral.

BRIEF DESCRIPTION OF THE DRAWINGS

The present disclosure will now be described by way of example only with reference to the accompanying drawings in which:

FIGS. 15A-15B further illustrate a method of manufacturing a magnetic multi-turn sensor in accordance with embodiments of the disclosure;

FIGS. 16A-16B further illustrate a method of manufacturing a magnetic multi-turn sensor in accordance with embodiments of the disclosure;

FIGS. 17A-17B further illustrate a method of manufacturing a magnetic multi-turn sensor in accordance with embodiments of the disclosure;

DETAILED DESCRIPTION

Figure 1:
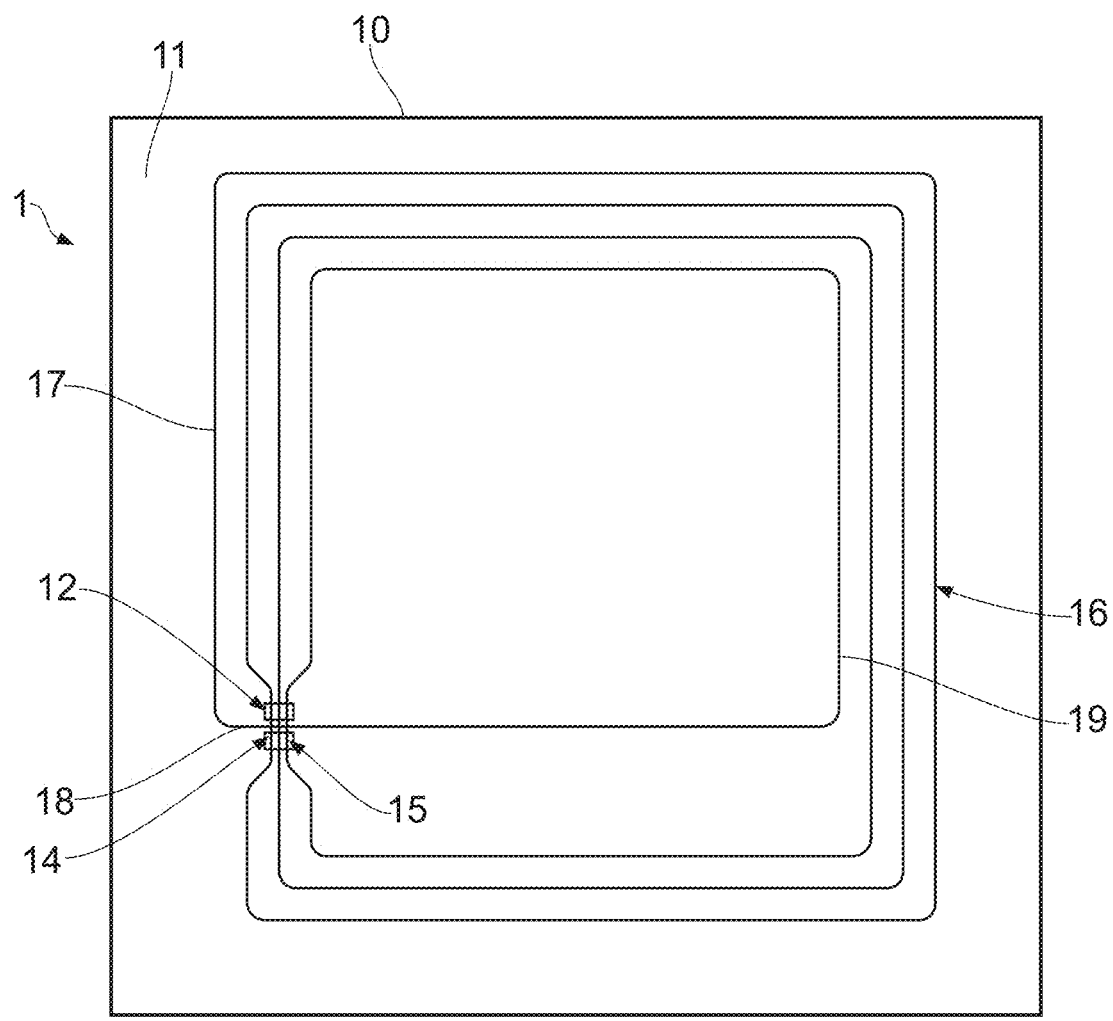
FIG. 1 illustrates a magnetic multi-turn sensor according to an embodiment of the disclosure.

Magnetic multi-turn sensors can be used to monitor the turn count of a rotating shaft. To do this, a magnet is typically mounted to the end of the rotating shaft, the multi-turn sensor being sensitive to the rotation of the magnetic field as the magnet rotates with the shaft. Such magnetic sensing can be applied to a variety of different applications, such as automotive applications, medical applications, industrial control applications, consumer applications, and a host of other applications which utilize information regarding a position of a rotating component.

Magnetic multi-turn sensors typically include giant magnetoresistive (GMR) elements or tunnel magnetoresistive (TMR) elements that are sensitive to an applied external magnetic field arranged in a spiral or closed loop configuration. As an external magnetic field rotates, it causes domain walls to propagate through the spiral, which change the magnetic alignment of each magnetoresistive element as it passes through. The resistance of the magnetoresistive elements change as the magnetic alignment changes, the variations in the resistance being tracked to determine the number of turns in the magnetic field. One of the main advantages of closed loop sensors is that it effectively provides numerous spirals connected together, thus enabling a very high number of turns to be counted. However, there are many challenges with fabricating such sensors since the magnetoresistive film is thin, and thus it can be difficult to connect the inner and outer spirals since the connecting wire crossing the rest of the spiral can disrupt the domain walls, leading to non-propagation and a corrupted turn count.

The present disclosure provides a magnetic multi-turn sensor comprising a continuous coil of magnetoresistive elements and a method of manufacturing said sensor that enables the inner and outer spiral to be connected without interfering with the magnetoresistive elements therebetween. The continuous coil is formed on a substrate such as a silicon wafer that has been fabricated so as to form a trench and bridge arrangement that provides a shielded crossing over or under the spiral. Once the substrate has been fabricated with the trench and bridge arrangement, a film of the magnetoresistive material can be deposited to form a continuous coil on the surface of the substrate. In doing so, a multi-turn sensor comprising a continuous coil is provided that is capable of measuring a large number of turns using no or very little power. The non-volatile character of the magnetic domain position, that is, the pattern with which the magnetoresistive elements change domain as domain walls propagate through the spiral, allows the multi-turn sensor to count the number of turns in the external magnetic field without any power. As the magnetic field rotates, the magnetic domain of each of the magnetoresistive elements changes in a specific pattern, which provides a corresponding pattern of resistances measured across the multi-turn sensor. As such, power can be provided when read-out is needed, wherein the measured resistances at that moment of time correspond to a particular point in the pattern, and thus a specific number of turns.

Figure 2:
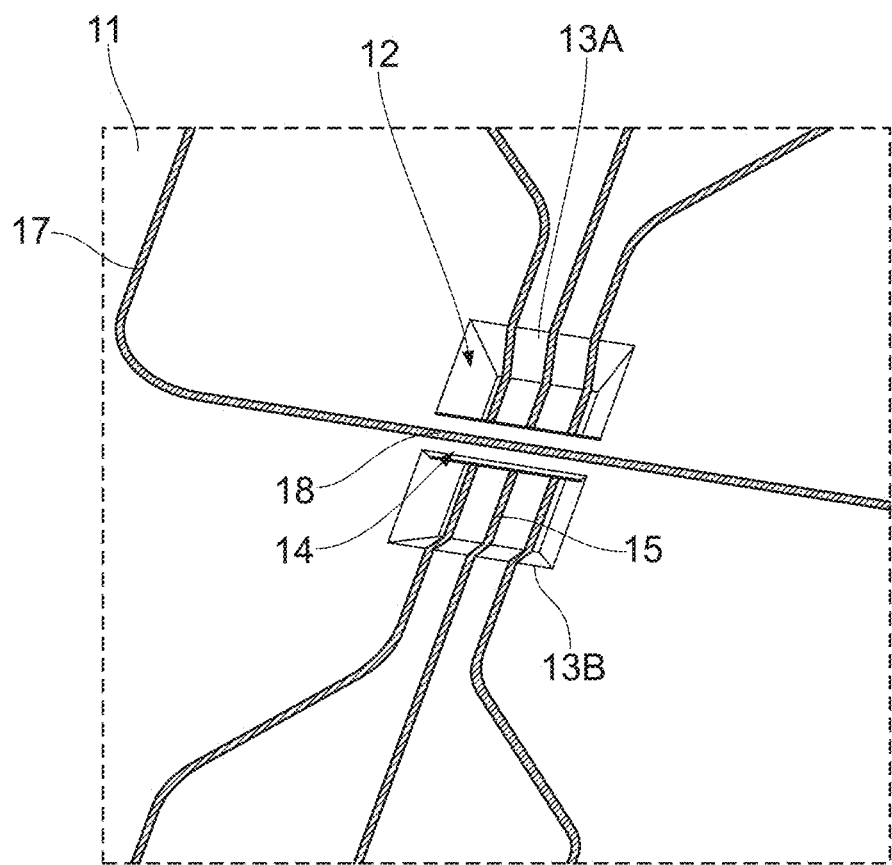
FIG. 2 further illustrates a magnetic multi-turn sensor according to an embodiment of the disclosure.

FIGS. 1 and 2 illustrate a multi-turn sensor 1 according to an embodiment of the present disclosure. The sensor 1 comprises a substrate 10, for example, a Silicon-based substrate, having a surface 11, with a trench 12 being formed in one region of the substrate surface 11, for example, by etching the substrate surface 11, as shown in more detail in FIG. 2. The trench 12 is formed such that a portion of the substrate surface 11 is preserved so as to form a bridge 14 over the trench 12. A film of magnetoresistive material can be then deposited on the substrate 10 so as to form magnetoresistive tracks 16 arranged in a spiral configuration having a plurality of segments arranged in series with each other. As such, each arm of the spiral provides a magnetoresistive sensing element that can change resistance in response to a change in magnetic alignment state in the presence of an externally applied magnetic field. The magnetoresistive tracks 16 defining one side 15 of the spiral are arranged to pass through the trench 12 and under the bridge 14. Each end of the trench 12 can be provided with a ramp 13A, 13B to provide a smooth pathway from the bottom of the trench 12 to the upper substrate surface 11 to allow the magnetoresistive tracks 16 to enter and exit the trench 12.

To form the bridge 14, the trench 12 and the ramps 13A, 13B leading in and out of the trench 12, the substrate 10 may be etched using a multi-stage lithographic etch process. For example, a first lithographic exposure and etch for the main body of the trench 12, a second lithographic exposure and etch for the ramps 13A and 13B of the trench 12, and a third lithographic exposure and etch for the planar surface 11 surrounding the trench 12 and the bridge 14.

The outer spiral winding 17 passes around the outside of the trench 12 and is connected to the inner spiral winding 19 via a connecting magnetoresistive track 18 deposited on the bridge 14. As such, this bridge 14 and trench 12 arrangement enables the connecting magnetoresistive track 18 to cross over one side 15 of the spiral without interfering with domain propagation in the magnetoresistive tracks on that side 15. Preferably, the connecting magnetoresistive track 18 is a magnetoresistive track contributing to the turn count of the multi-turn sensor, however, it will be appreciated that in other arrangements the connecting portion could comprise some other soft ferromagnetic material.

Figure 3:
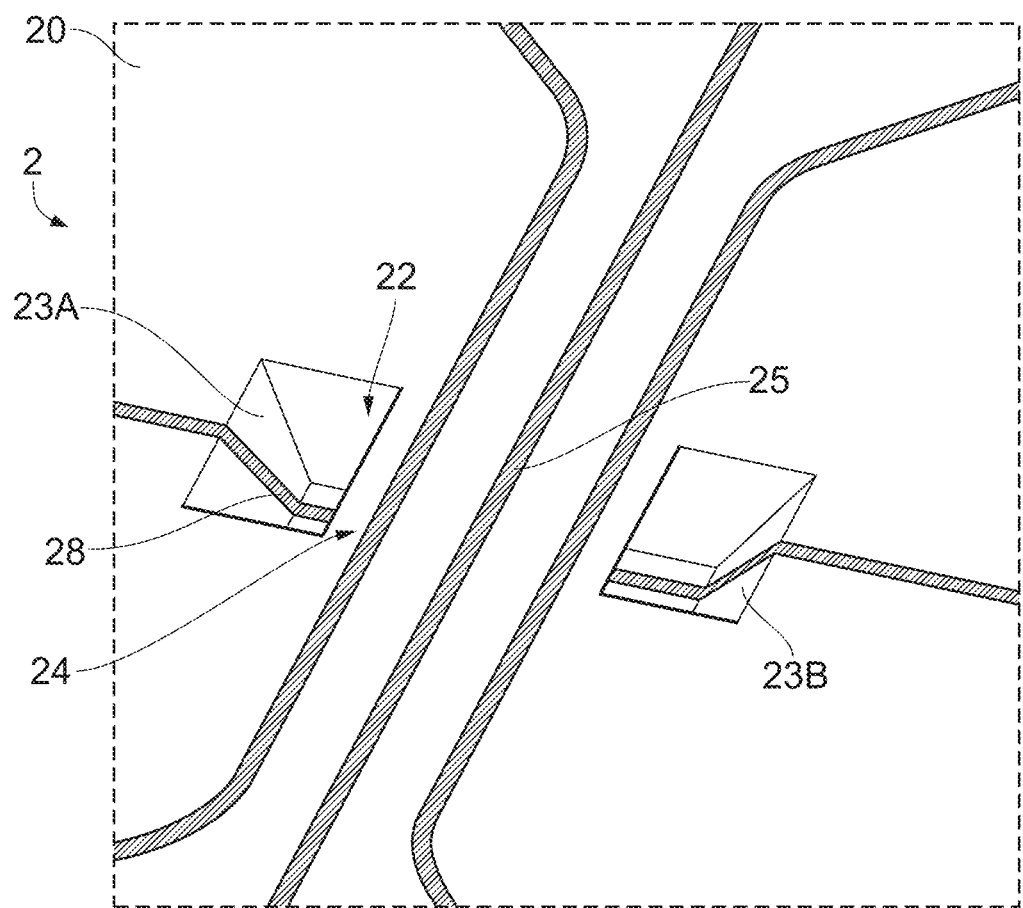
FIG. 3 further illustrates a magnetic multi-turn sensor according to a further embodiment of the disclosure.

In alternative arrangement, as shown by FIG. 3, a sensor 2 is provided with a narrow trench 22 formed in the substrate 20 to provide the crossing for the connective magnetoresistive track 28 from the inner spiral winding to the outer spiral winding, with one or more bridges 24 formed over the narrow trench 22 to support the magnetoresistive tracks 25 on that side of the spiral. That is to say, the magnetoresistive tracks 25 of the spiral cross over the connecting magnetoresistive track 28. In the example of FIG. 3, one wide bridge 24 is formed that supports all of the magnetoresistive tracks 25 forming one side of the spiral. In other arrangements, several individual bridges may be formed over the narrow trench 22, each supporting a single magnetoresistive track 25. As described above, the trench 22 and bridge 24 arrangement may be formed by etching the substrate 20.

Figure 4B:
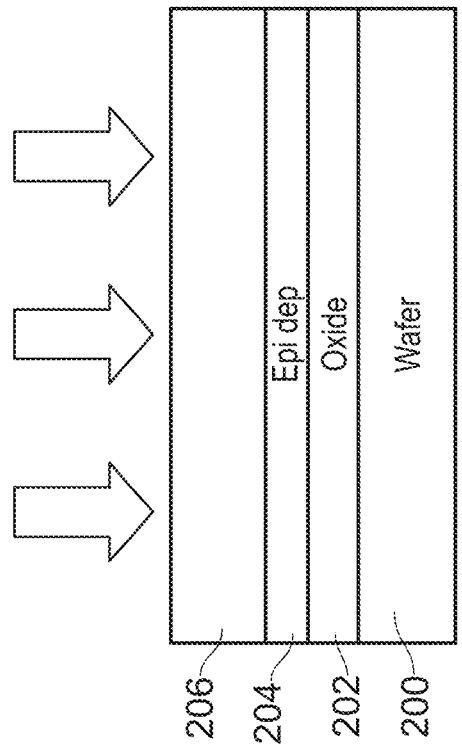
FIGS. 4A-D are schematic side views illustrating a method of manufacturing a magnetic multi-turn sensor in accordance with embodiments of the disclosure.
Figure 4A:
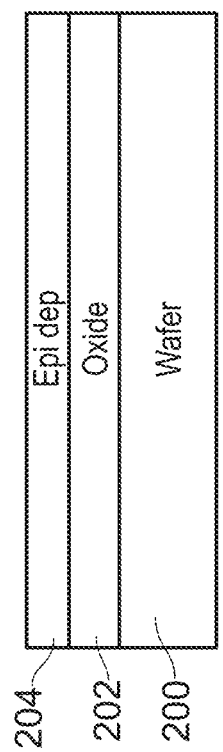

FIGS. 4A-D illustrate a first stage in a method of fabricating a multi-turn sensor in accordance with embodiments of the present disclosure. As shown in FIG. 4A, the substrate is fabricated by first growing or depositing an intermediate layer 202, preferably an oxide layer, on a silicon wafer 200. It will however be appreciated that the wafer 200 may be formed of a UV transparent material such as glass or Sapphire, in which case the oxide layer 202 will be deposited thereon. The oxide layer 202 may also be a layer of nitride, oxynitride or similar material. A mask layer 204, for example an epi silicon or similar material, is then deposited on the oxide layer 202. The thickness of the mask layer 204 will depend at least in part on the thickness of the bridge 24.

Figure 4D:
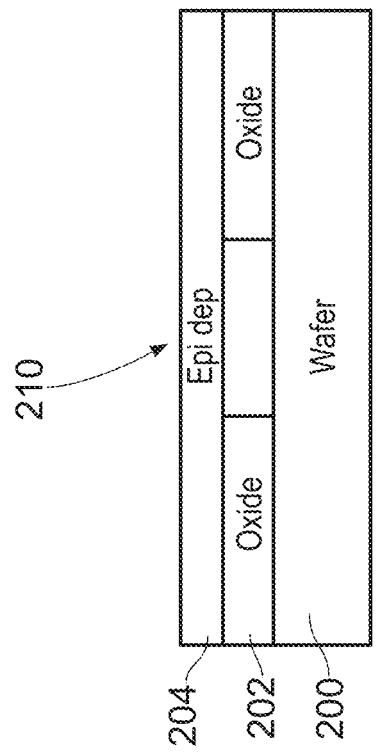
Figure 4C:
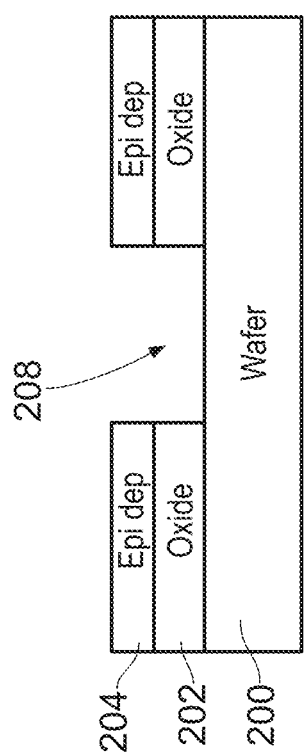

As shown in FIG. 4B, a photoresist layer 206 is then formed on the substrate in order to etch a trench 208, as shown in FIG. 4C, the oxide layer 202 being removed to deepen the trench 208 to a particular depth. As shown in FIG. 4D, a portion of the mask layer 204 is preserved to form a bridge 210 over the trench 208. The trench 208 and bridge 210 may also be etched using a staged lithographic etch. For example, a first lithographic exposure and etch for the main body of the trench 208, a second lithographic exposure and etch for the ramps of the trench 208 (i.e. ramps 13A and 13B in FIGS. 1-3), and third lithographic exposure and etch for the planar surface surrounding the trench 208 (i.e. the upper surface 11 and bridge 14 of FIGS. 1-3).

Figure 9A:
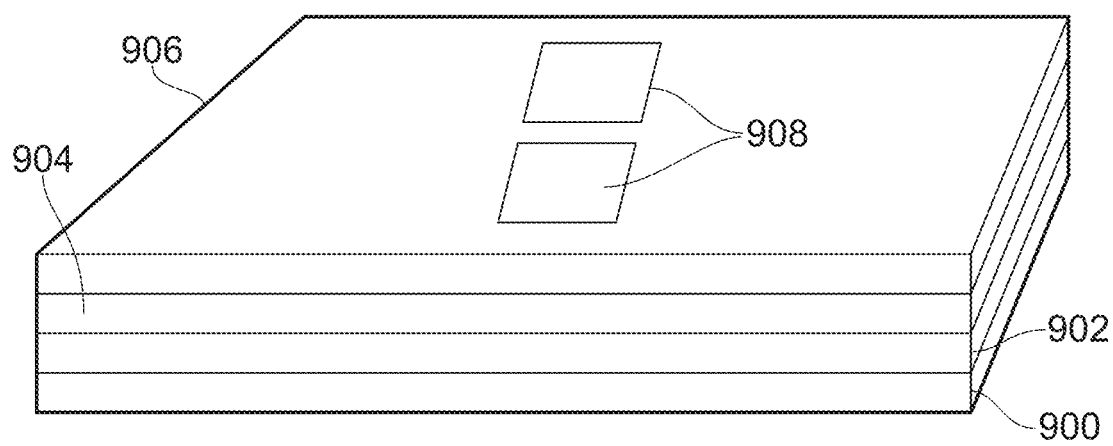
FIGS. 9A-9B further illustrate a method of manufacturing a magnetic multi-turn sensor in accordance with embodiments of the disclosure.
Figure 9B:
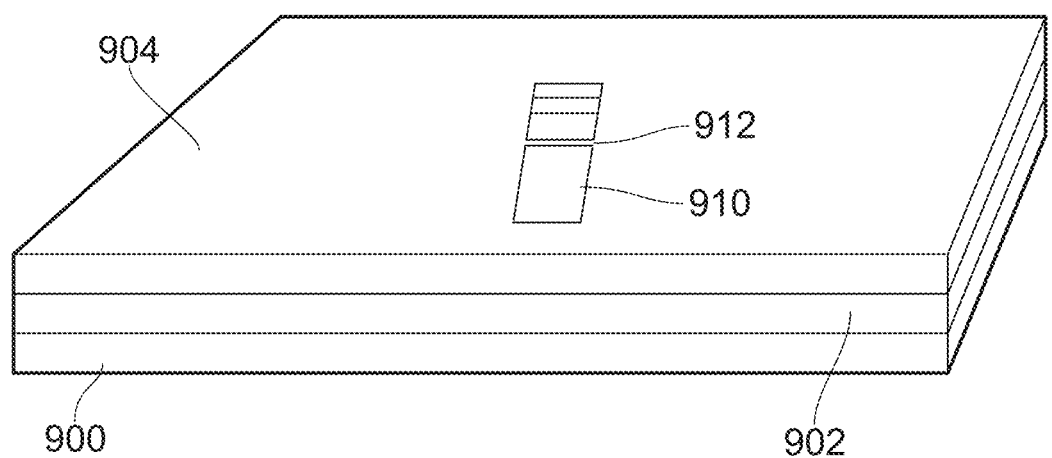

The method by which the trench is formed is further illustrated by FIGS. 9A-B. As shown in FIG. 9A, substrate comprises a wafer 900 that is formed of silicon with a Miller index of (100), or a UV transparent material such as glass or Sapphire. An oxide layer 902 is formed on the wafer 200, followed by a mask layer 904 formed of epi silicon or the like. As before, a resist 906 is deposited on the substrate, a pattern 908 being formed on the resist to expose the portion that will become the trench and define the bridge. The mask layer 904 and oxide layer 902 are then etched to form the trench 910 and the bridge 912, as shown in FIG. 9B. Whilst a single narrow bridge 912 with a wide trench 910 is shown, it will of course be appreciated that any suitable number and size of bridges and trenches may be formed by using an appropriate pattern on the resist.

Figure 10A:
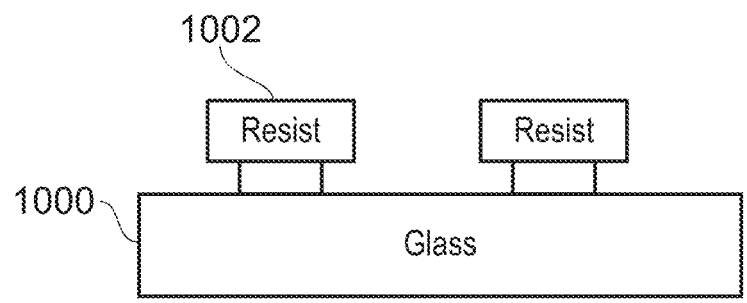
FIGS. 10A-10D illustrate a further method of manufacturing a magnetic multi-turn sensor in accordance with embodiments of the disclosure.
Figure 10B:
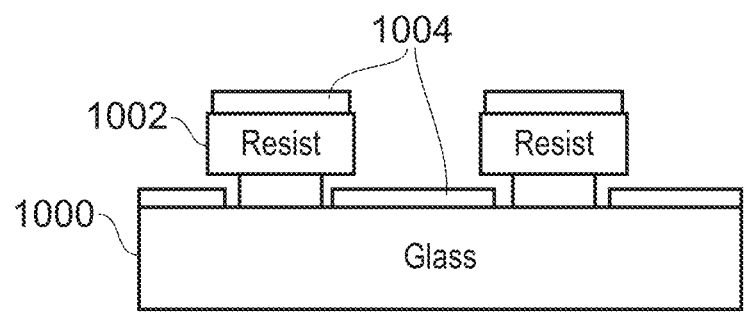
Figure 10C:
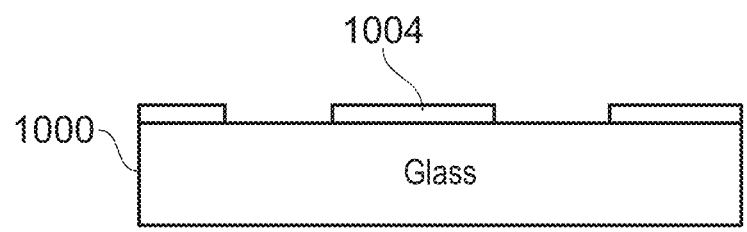
Figure 10D:
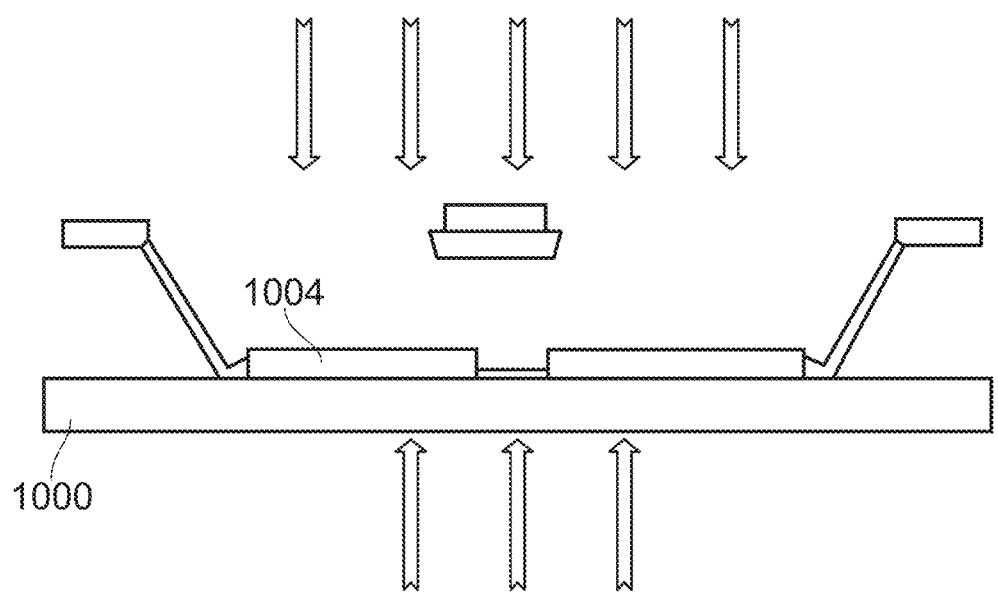

In cases where a UV transparent material such as glass or Sapphire is used for the substrate, a lift off process may be used to form the magnetoresistive tracks that are in the trench and on the bridge, as illustrated by FIGS. 10A-10D. Within the exposed trench portion, a photoresist material 1002 may be sprayed onto the transparent substrate 1000, as illustrated by FIG. 10A. A layer of the magnetoresistive material 1004 is then deposited onto the substrate 1000 and photoresist material 1002, as illustrated by FIG. 10B. A lift off process and resist removal is then performed, as illustrated by FIGS. 10C and 10D, whereby ultraviolet light from below and above the substrate 1000 is used to remove the photoresist material 1002 and lift off portions of the magnetoresistive material 1004, with the remaining magnetoresistive material 1004 forming the tracks of the multi-turn sensor.

An alternative method of forming the bridge and trench arrangement is to use a bulk micromachining approach, wherein the bridge is formed by means of a hard mask layer and selective etching. In such cases, the substrate (i.e. the silicon wafer 200 and oxide layer 202) is provided with a hard mask layer, such as a silicon oxide layer, a silicon oxynitride or a silicon nitride, which is inert to the etchant (for example, potassium hydroxide (KOH), ethylenediamine pyrocatechol (EDP) or tetramethylammonium hydroxide (TMAH), and the like) being used to form the trench. Using a selective etchant that attacks the oxide layer 202, but not the mask layer, enables a trench to be formed underneath the bridge.

During this process, special care needs to be taken for the orientation of the bridge with respect to the crystalline orientation of the substrate. Since the {111} planes act as a natural etch stop, the bridge needs to be tilted with respect to the {110 planes}. An "n" isotropic etch can then also be used to smoothen the side wall profiles and flatten the bottom of the trench. Another option is to tilt the substrate beneath the bridge so as to orientate the trench with angle relative to the {110} planes, such that the {111} planes have a different orientation towards the trench opening.

An example of this bulk micromachining approach is illustrated by FIGS. 11A-11D. A shown in FIG. 11A, a wafer 1100 and oxide layer 1102 are provided. The wafer 1100 is formed of a silicon with a Miller index of (110), with the edges of the long sides aligned to the <112> direction and the short side aligned to the <111> direction. In this respect, the <112> direction is 54.74° from the <110> face, which will create vertical edges on the long edges and a ramp on the short edges at 35.3°.

Figure 11A:
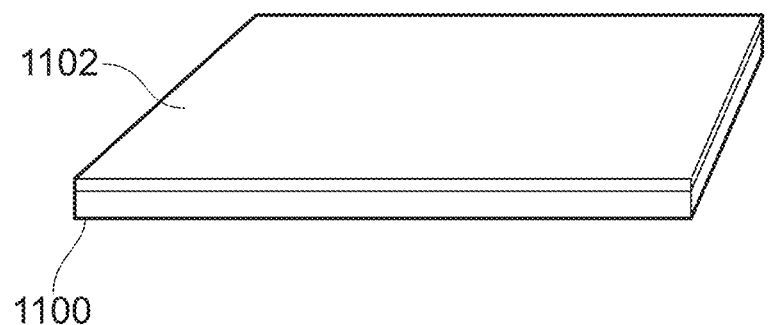
FIGS. 11A-11D illustrate a further method of manufacturing a magnetic multi-turn sensor in accordance with embodiments of the disclosure.
Figure 11B:
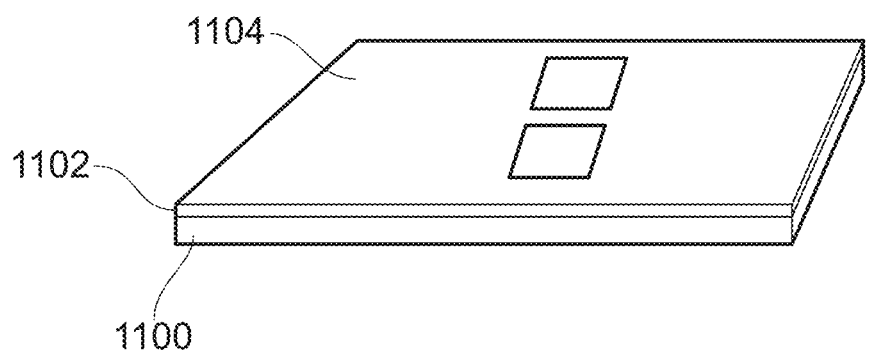
Figure 11C:
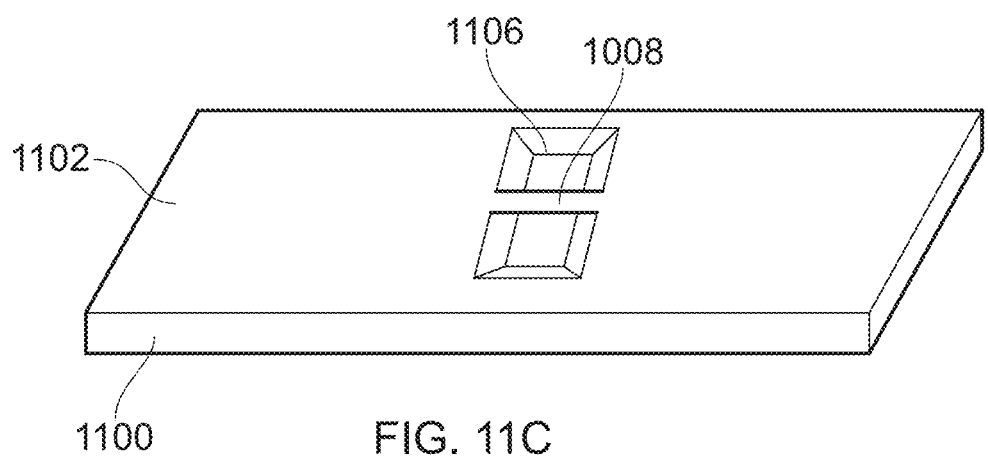
Figure 11D:
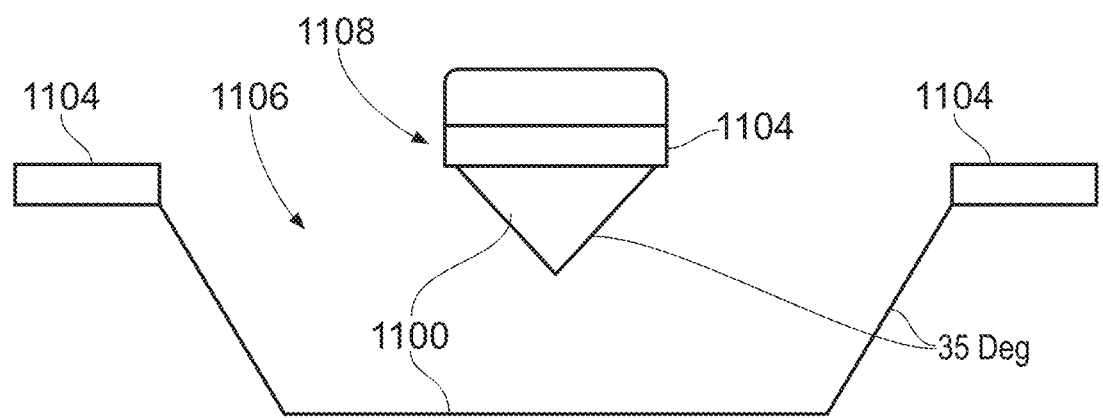

A masking layer 1104 formed of an oxide or nitride (such as those described above) is formed on the oxide layer 1102, as shown in FIG. 11B. An etchant (such as a KOH etchant) is then used to etch the trench 1106 and bridge 1108, the depth of the trench 1106 being dependent on the time in the etchant, as shown in FIG. 11C. In some cases, the bridge 1108 may need to be formed at an angle due to the etchant leaving a facet under the bridge 1108, as illustrated by FIG. 11D. By tilting the masking layer 1104, this enables the undercutting to form the bridge 1108, with the wafer 1100 portion of the bridge 1108 having sloped walls, for example, at an angle of 35 degrees. This also provides easier access to the region directly under the bridge 1108, thereby making it easier to uniformly deposit magnetoresistive material within the trench 1106. Similarly, the masking layer 1104 in the region of the trench 1106 may also be tilted to form the sloped walls of the trench 1106, which again may be at an angle of 35 degrees. It will however be appreciated that the sloped walls of the trench 1106 and bridge 1108 may be at any suitable angle.

Figure 13:
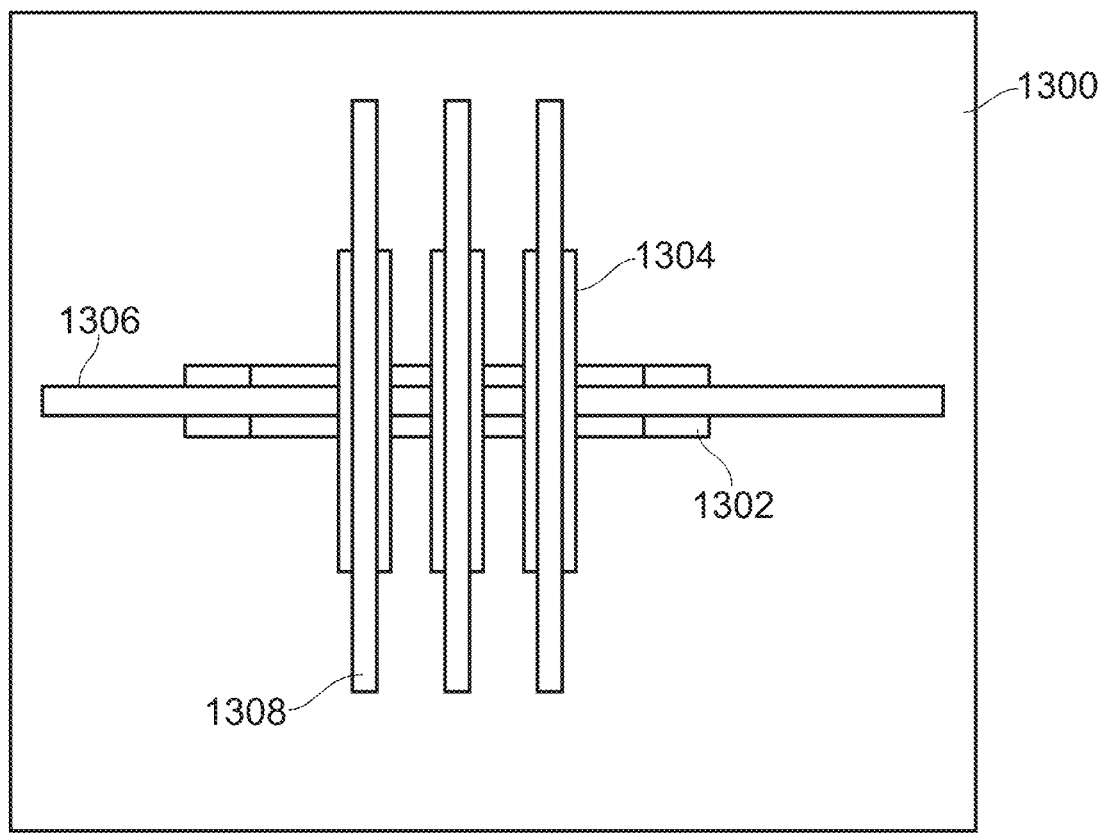
FIG. 13 illustrates a portion of magnetic multi-turn sensor according to an embodiment of the disclosure.
Figure 14:
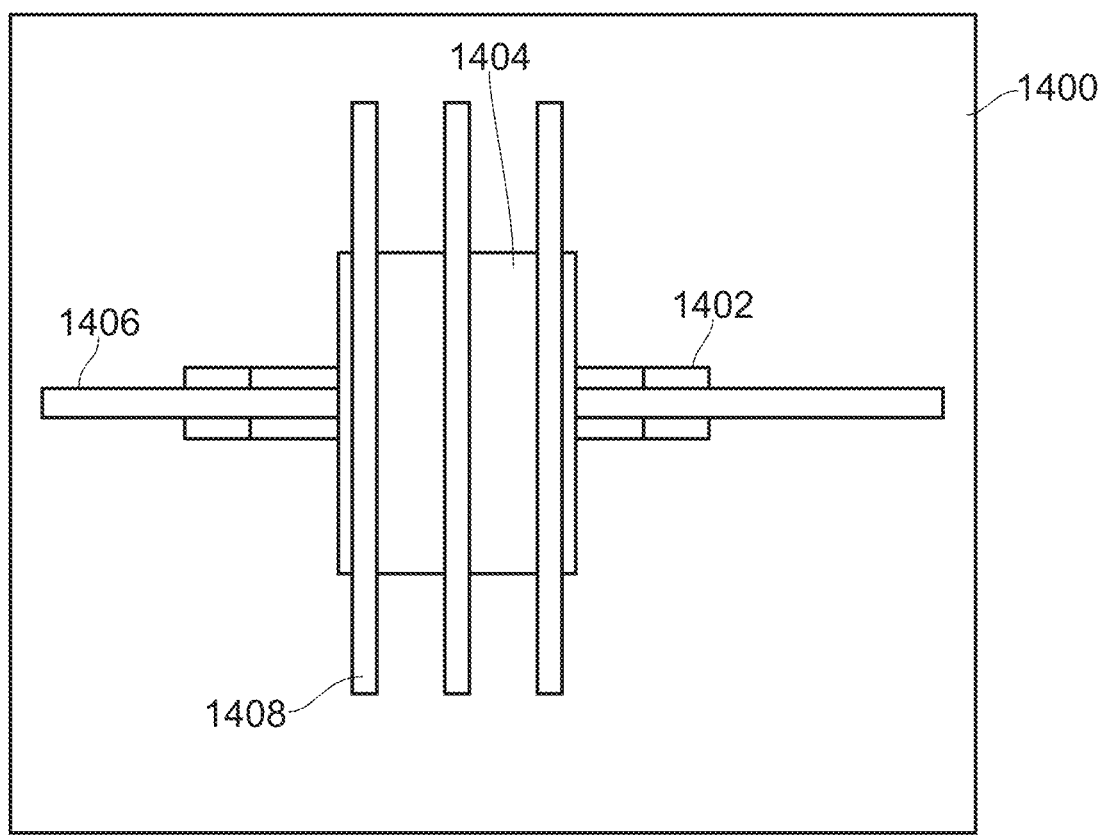
FIG. 14 illustrates a portion of magnetic multi-turn sensor according to a further embodiment of the disclosure.
Figure 18A:
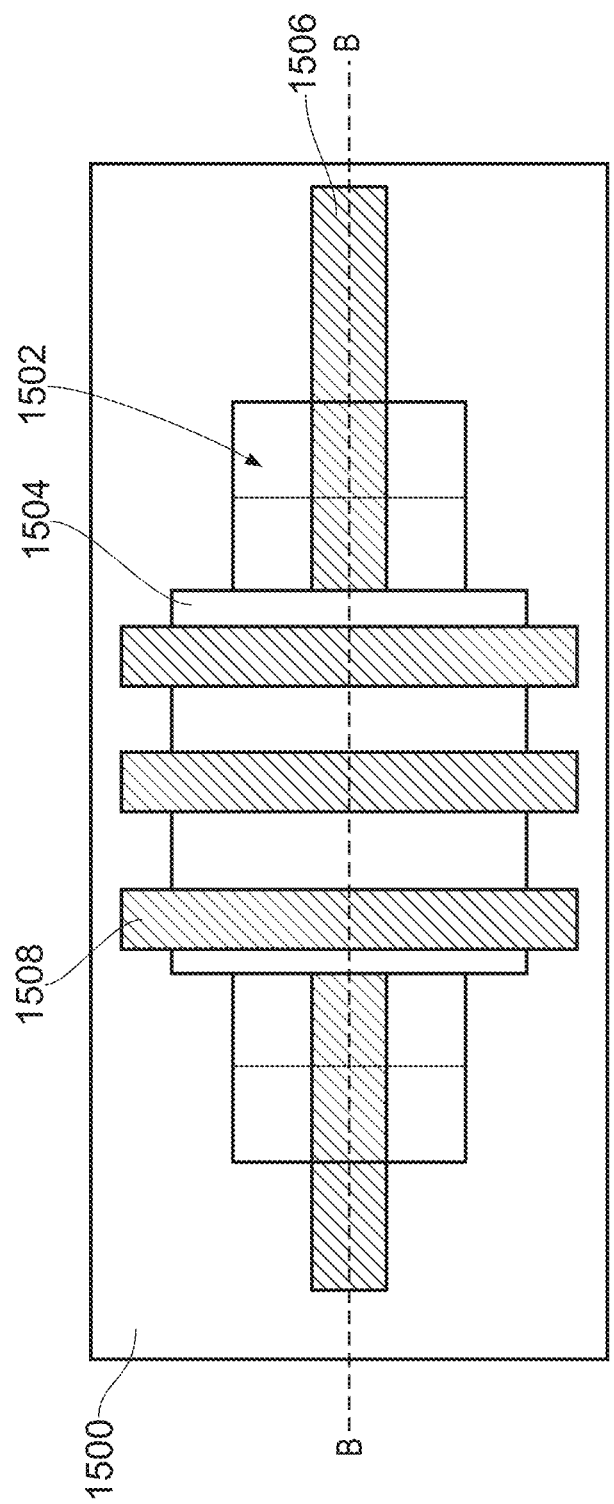
FIGS. 18A-18B further illustrates a method of manufacturing a magnetic multi-turn sensor in accordance with embodiments of the disclosure.
Figure 18B:
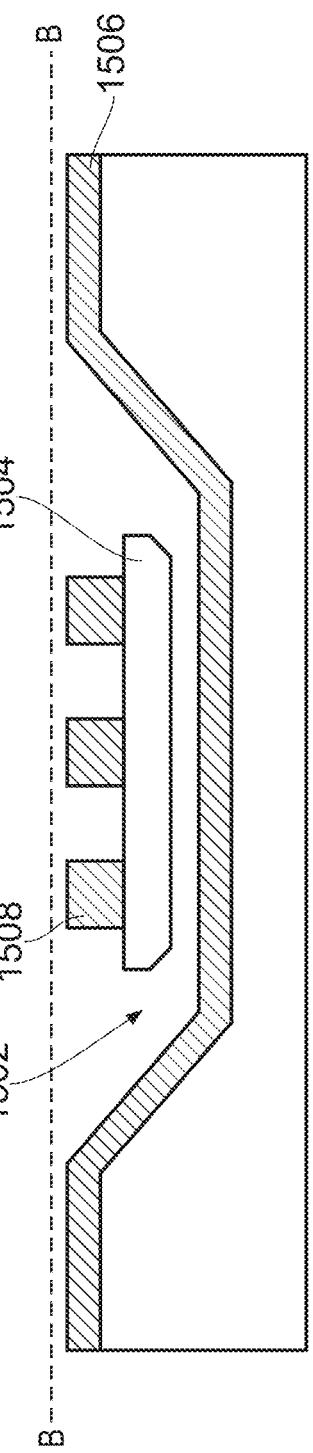

The width of the trench 208 and bridge 210 will depend at least in part on how many magnetoresistive tracks will be formed along the trench. In the case where the trench 208 receives one side of the spiral, as shown in FIGS. 1 to 3, then the width of trench 208 will depend at least in part on how many windings the spiral has and the spacing between each set of tracks, whilst the bridge 210 can be wide enough to support the track connecting the inner and outer spiral windings. In cases where the trench 208 is arranged to receive the track connecting the inner and outer spiral windings, then the trench 208 can be wide enough to receive one track. In such cases, as shown in FIG. 14, there may be one bridge 1404 formed over the trench 1402 that is wide enough to receive all of the tracks 1408 on that side of the spiral, whilst the trench 1402 is wide enough to receive the connecting track 1406. Alternatively, as shown in FIG. 13, several bridges 1304 may be formed to receive each track 1308 individually.

In either case, the bridge 210 should be as narrow as possible to limit the amount of shadowing, whilst the trench 208 is preferably as wide as possible to reduce shadowing effects. For example, for magnetoresistive tracks of 350 nm in width, a bridge 210 of around 3 µm and a trench of around 29 µm may be provided. Likewise, where there are multiple tracks running alongside each other, either along the trench or across one or more bridges, the tracks should be spaced apart a suitable distance that they do not interfere with one another.

The depth of the trench 208 should also be selected so as to minimise the amount of shadowing, whilst at the same time enabling the magnetoresistive tracks to easily enter and exit the trench 208.

It will be appreciated that other suitable fabrication methods may be used to etch the trench and bridge arrangement. For example, the ramps at either end of the trench may be formed using "bird's beak" as a fabrication process. Similarly, a microlens may be used with the lithographic exposure to etch out the trench underneath the bridge.

Once the substrate has been formed with the trench and bridge arrangement, a film of magnetoresistive material may be deposited on the substrate and etched to form the magnetoresistive tracks 16 shown in FIGS. 1-3.

Figure 12:
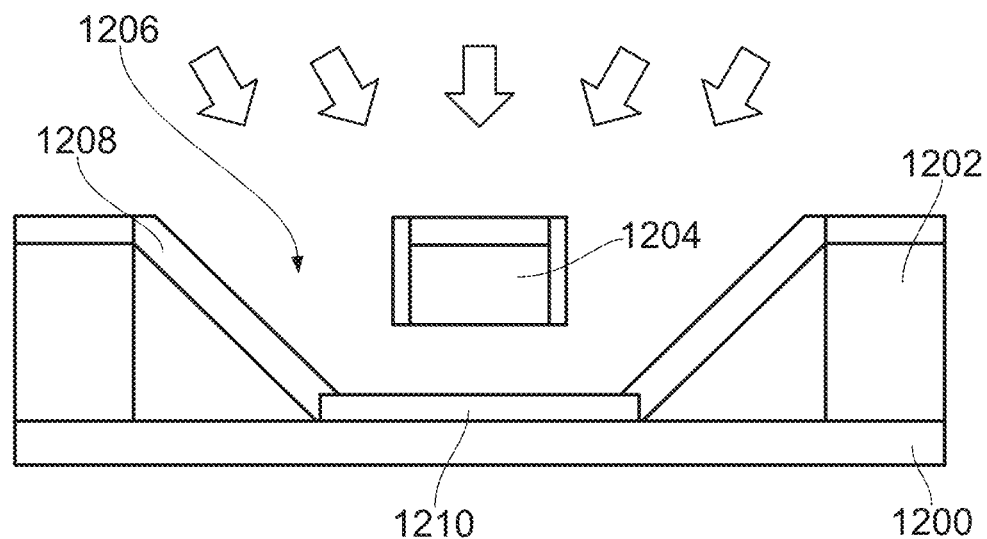
FIG. 12 illustrates a method of manufacturing a magnetic multi-turn sensor in accordance with embodiments of the disclosure.

The thickness of the magnetoresistive tracks affects the operational behaviour in an externally applied magnetic field, for example, the magnetic field strength window in which the resistor changes magnetic alignment. Therefore, it is important that the magnetoresistive film is deposited uniformly to provide tracks of uniform thickness, to thereby ensure errors do not occur in the turn count. To deposit the film in uniform layers under the bridge, an angled physical vapour deposition may be used, wherein the sputtering system is titled at an angle and the substrate rotated. FIG. 12 shows a cross-section of the substrate comprising a wafer 1200 and an oxide layer 1202 in which a bridge 1204 and trench 1206 have been formed. A film 1208 has been deposited onto the bridge 1204 and into a trench 1206 such that track of uniform thickness is formed. This has been done by tilting the sputtering system at different angles depending on the target region. For example, a 90° relative to the wafer 1200 may be used for depositing the film 1208 onto the bridge 1204, with the smallest angle then being used to deposit the film 1208 directly under bridge 1204 in the region denoted 1210. Using the same angle for all regions would mean a thinner film on the ramp portions of the trench 1206, with possible pinning sites or discontinuity in the region 12010. The angle of tilt can thus be chosen to ensure that the film is uniformly deposited under the bridge without any shadowing caused by the bridge and walls of the trench.

In some arrangements, the angled deposition may be performed for the free layer of the magnetoresistive film. In some arrangements, the angled deposition may only be performed for the free layer of the magnetoresistive film, that is, the ferromagnetic material that has a magnetisation that is free to change direction to thereby provide the change in resistance as an external magnetic field rotates. Therefore, since it is this magnetisation of this portion of the magnetoresistive stack that is being measured, it is important that this portion of the film is uniform to ensure consistent readings.

Once the film has been deposited uniformly, the film is etched to form the tracks, for example, using ion beam etching or reactive-ion etching. For the portions under the bridge, the reactive-ion etch may be performed at an angle to again etch the film in a uniform manor. It will of course be appreciated that any suitable angle may be used, depending on the depth of the trench and thickness of the bridge. Likewise, it will also be appreciated that other methods of etching the tracks may also be used.

In some case, once the magnetoresistive film has been deposited in the trench and etched to provide the magnetoresistive tracks of the sensor spiral, the trench may be filled with a polyimide material to help provide mechanical robustness to the structure during any subsequent processing steps.

FIGS. 15A-B to 18A-B further illustrate a method by which the magnetoresistive tracks are formed, in the case where the bridge 1504 is configured to receive the magnetoresistive tracks 1508 of one side of the spiral, whilst the trench 1502 is arranged to receive a single track 1506 connecting the inner and outer spiral windings.

A first stage in the method is shown in FIGS. 15A and 15B. Here, FIG. 15B shows a cross-sectional view of FIG. 15A looking down the length of the trench 1502, perpendicular to the axis A. Firstly, magnetoresistive material is blanket deposited over the substrate 1500, such that magnetoresistive material is deposited over the bridge 1504 and along the trench 1502. A lithographic pattern is then used to etch a plurality of tracks 1508 along the bridge 1504 and a single track 1506 along the trench 1502. The trench 1502 is formed to be the same width as the target width of the magnetoresistive track 1506 and so there is no need to define the width of the track 1506 during the lithographic etch. However, a region of magnetoresistive material 1510 may be left on the side walls of the trench 1502.

To address this, width of the trench 1502 in the region of the bridge 1504 is widened, as illustrated by FIGS. 16A and 16B. Again, FIG. 16B shows a cross-sectional view of FIG. 16A looking down the length of the trench 1502. The overlap region of magnetoresistive material 1510 can then be removed using some suitable method, for example, using Eco-Snow cleaning techniques or ion beam etching, thereby providing a single magnetoresistive track 1506 running along the length of the trench, as illustrated by FIGS. 17A-17B and 18A-18B.

Figure 5:
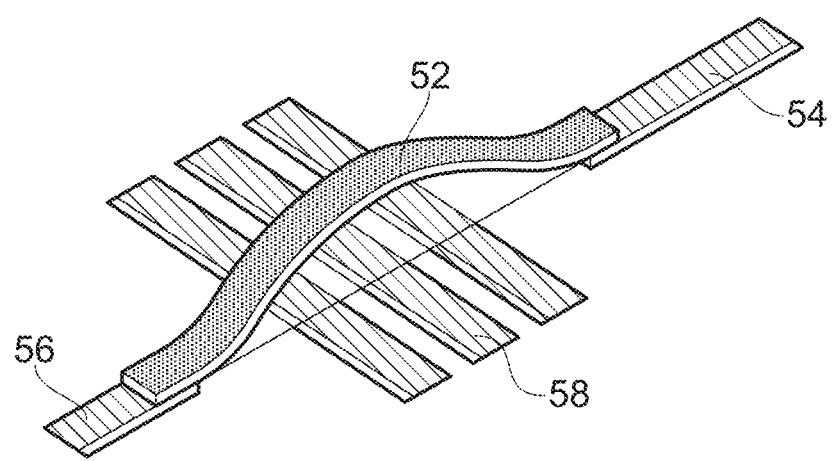
FIG. 5 illustrates a magnetic multi-turn sensor according to a further embodiment of the disclosure.

FIG. 5 provides an alternative embodiment of the present disclosure, wherein a trench is not formed in the substrate, but a bridge 52, for example, a permalloy strip or a bridge formed using any of the methods described herein, is formed over the magnetoresistive tracks 58 of the spiral to connect the inner and outer spiral windings 54, 56. In such arrangements, the bridge 52 may be formed of a soft magnetic material, and preferably a soft ferromagnetic material, comprising one of Nickel, Iron, or Cobalt, or an alloy containing at least one of Nickel, Iron, or Cobalt.

Figure 6:
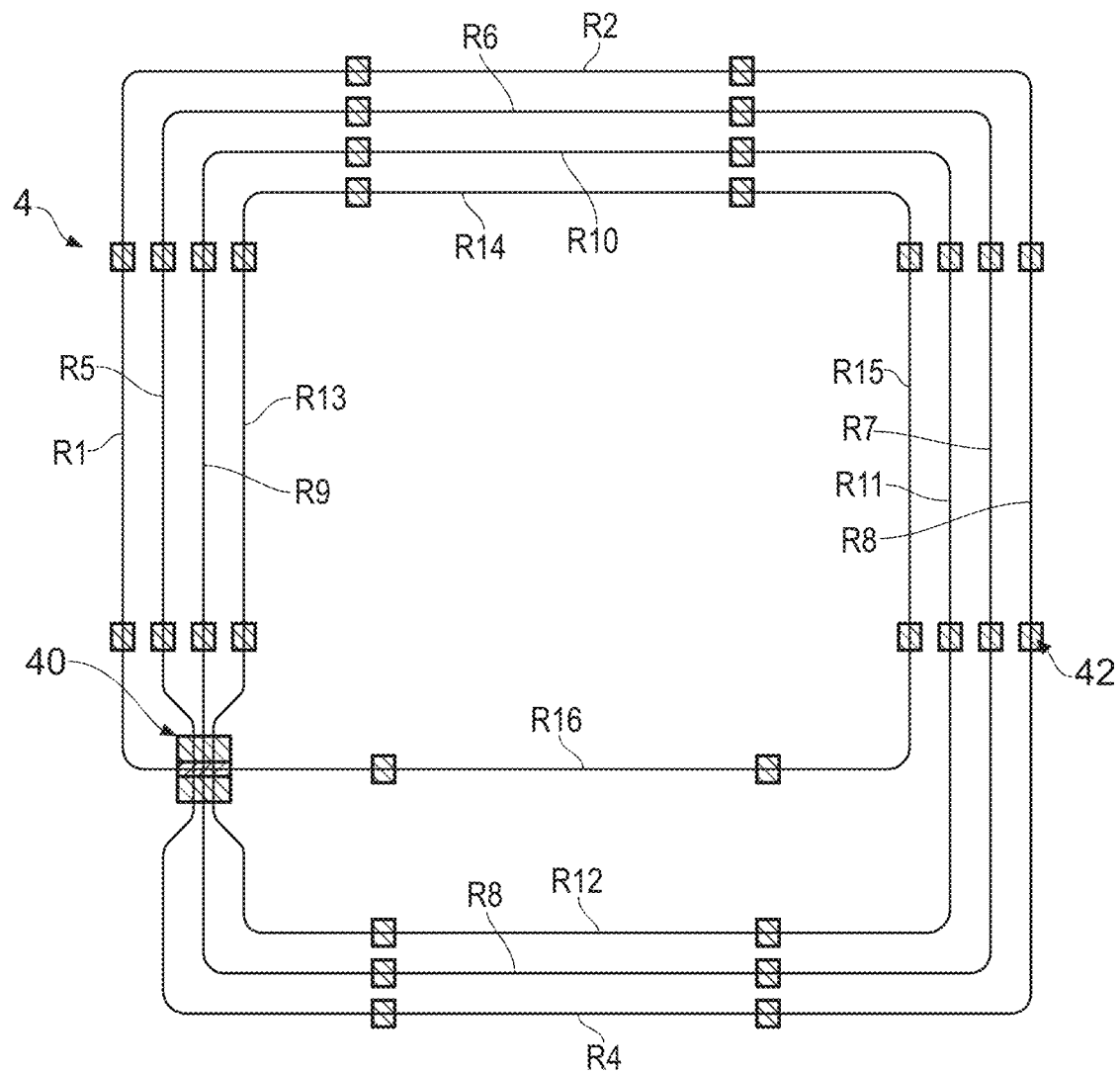
FIG. 6 is a diagram for illustrating the electrical connections of magnetic multi-turn sensor according to an embodiment of the disclosure.

FIGS. 6 to 8B illustrate methods by which the magnetoresistive tracks may be connected. FIG. 6 illustrates a magnetic multi-turn sensor 4, similar to those described with reference to FIGS. 1-3, comprising a plurality magnetoresistive tracks laid out in a spiral. The inner magnetoresistive track (corresponding to resistor R15) is connected to the outer magnetoresistive track (corresponding to resistor R1) via a connecting magnetoresistive track (corresponding to resistor R16) which crosses the spiral via a trench and bridge arrangement 40, as described above. The spiral comprises a plurality of metal contacts 42 along the spiral, which may be provided through deposition of a metallic material, to define a plurality of magnetoresistive sensing elements R1-R16, which can be connected to a power supply to enable their resistances to be measured.

Figure 7:
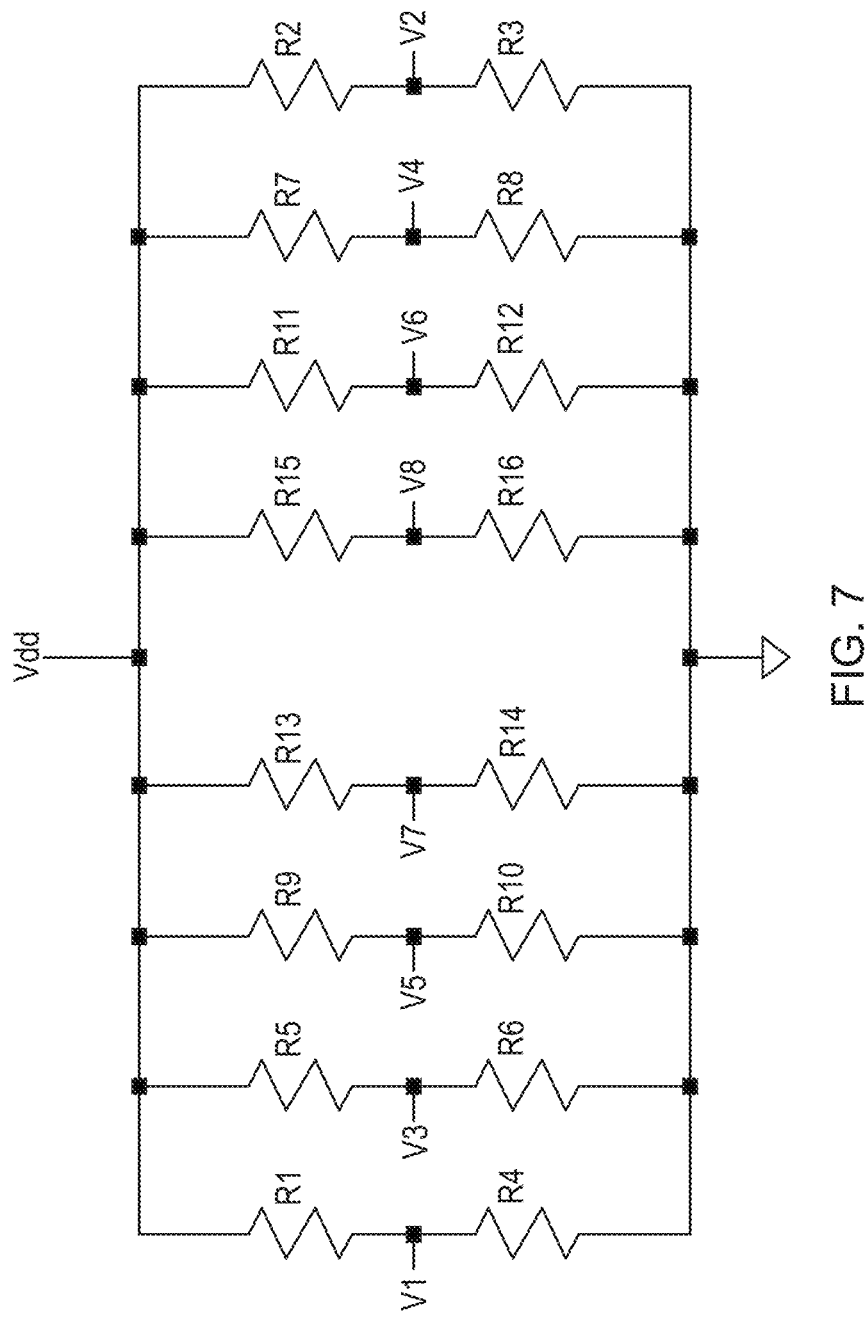
FIG. 7 illustrates a method of connecting the magnetoresistive sensing elements of a multi-turn sensor according to an embodiment of the disclosure.
Figure 8B:
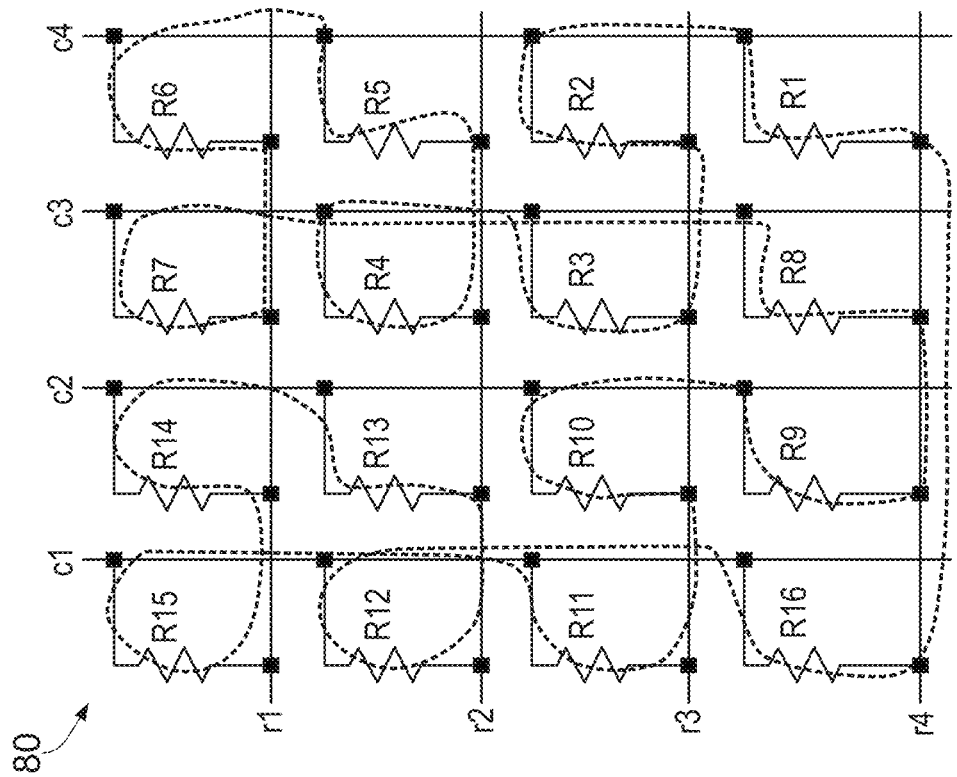
FIGS. 8A-B illustrates a further method of connecting the magnetoresistive sensing elements of a multi-turn sensor according to an embodiment of the disclosure.
Figure 8A:
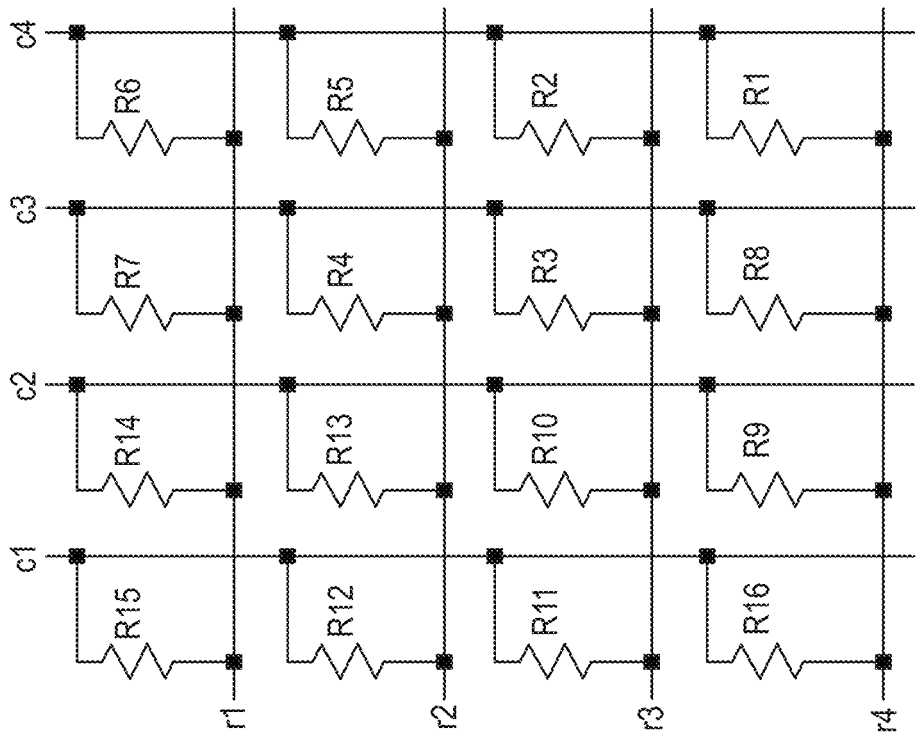

For example, as shown in FIG. 7, the magnetoresistive elements R1-R6 may be connected in a Wheatstone bridge arrangement. Alternatively, as shown in FIGS. 8A and 8B, the magnetoresistive elements R1-R6 may be connected in a matrix arrangement, wherein the line denoted 80 shows the path of the spiral itself, as described in more detail in German Publication No. DE102017104551A1 and US Publication No. 2017/261345, the contents of which are hereby incorporated by reference herein in their entirety.

Applications

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for correcting rotational angle position data derived from rotating magnetic fields. Additionally, the devices can include any magnetoresistance or Hall effect devices capable of sensing magnetic fields.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure.

The invention claimed is:

1. A magnetic multi-turn sensor, comprising:
   a plurality of magnetoresistive sensor elements connected in series and arranged in a continuous spiral configuration; and
   a substrate on which the plurality of magnetoresistive sensor elements are formed, the substrate comprising:
   a trench configured to receive at least one magnetoresistive element; and
   at least one bridge formed over the trench, the at least one bridge being formed by a portion of substrate and being configured to support at least one magnetoresistive element.

2. A magnetic multi-turn sensor according to claim 1, wherein the trench is configured to receive a plurality of magnetoresistive elements defining one side of the continuous spiral configuration, and wherein the substrate comprises one bridge configured to receive one magnetoresistive element connecting an inner and outer loop of the continuous spiral configuration.

3. A magnetic multi-turn sensor according to claim 1, wherein the trench is configured to receive one magnetoresistive element connecting an inner and outer loop of the continuous spiral configuration, and wherein the substrate comprises the at least one bridge formed over the trench for receiving a plurality of magnetoresistive elements defining one side of the continuous spiral configuration.

4. A magnetic multi-turn sensor according to claim 1, wherein the substrate comprises a plurality of bridges formed over the trench for receiving a plurality of magnetoresistive elements defining one side of the continuous spiral configuration, each bridge receiving one magnetoresistive element.

5. A magnetic multi-turn sensor according to claim 1, wherein the plurality of magnetoresistive elements are one of: giant magnetoresistive (GMR) elements or tunnel magnetoresistive (TMR) elements.

* * * * *